United States Patent
Le et al.

(10) Patent No.: US 6,418,301 B1
(45) Date of Patent: Jul. 9, 2002

(54) METHODS FOR RADIO CALIBRATION AT ROOM TEMPERATURE

(75) Inventors: Di-Luan Le, Ville St-Lauren; Guy Theberge, Saint-Joseph du Lac; Nacer Hassaine, Dollard-des-Ormeaux, all of (CA); Ying Shen, Torrance, CA (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/368,390

(22) Filed: Aug. 4, 1999

(51) Int. Cl.[7] ................................................. H04B 1/38
(52) U.S. Cl. ........................ 455/73; 455/67.1; 330/278; 330/289
(58) Field of Search .............................. 455/67.4, 67.1, 455/226.1, 115, 423, 424, 425, 73; 330/289, 278, 310

(56) References Cited

U.S. PATENT DOCUMENTS

| | | | |
|---|---|---|---|
| 4,050,022 A | 9/1977 | McFadyeb et al. | 325/315 |
| 5,192,919 A | 3/1993 | Wieczorek | 330/129 |
| 5,230,091 A | 7/1993 | Vaisanen | 455/88 |
| 5,408,697 A | 4/1995 | Price et al. | 122/239.1 |
| 5,423,070 A | 6/1995 | Vaisaneri et al. | 455/67.1 |
| 5,471,654 A | 11/1995 | Okazzaki et al. | 455/126 |
| 5,722,056 A | 2/1998 | Horowitz et al. | 435/126 |
| 5,873,029 A | 2/1999 | Grondahl et al. | 455/126 |
| 6,018,646 A * | 1/2000 | Myllymaki et al. | 455/115 |
| 6,118,409 A * | 9/2000 | Pietsch et al. | 374/703 |
| 6,195,562 B1 * | 2/2001 | Pirhonen et al. | 455/553 |
| 6,259,912 B1 * | 7/2001 | Si | 455/424 |

FOREIGN PATENT DOCUMENTS

| EP | 0 420 505 | 4/1991 | H03J/3/04 |
|---|---|---|---|
| WO | 96/33555 | 10/1996 | H03G/3/20 |

* cited by examiner

Primary Examiner—Edward F. Urban
Assistant Examiner—Naghmeh Mehrpour
(74) Attorney, Agent, or Firm—Allen, Dyer, Doppelt, Milbrath & Gilchrist, P.A.

(57) ABSTRACT

Each radio of a plurality of radios includes a plurality of variable gain stages connected in series. The radio further includes at least one power detector connected to the variable gain stages, a temperature sensor, and a processor for controlling the variable gain stages in-service based upon the at least one power detector, the temperature sensor, and stored frequency and power compensation values. A method for calibrating each radio includes generating frequency compensation values for at least one first variable gain stage by supplying a first calibration signal swept in frequency while maintaining the radio at a constant temperature. The method further includes generating power compensation values for at least one second variable gain stage by supplying a second calibration signal swept in power level and while maintaining the radio receiver at a constant temperature. The frequency and power compensation values generated at the constant temperature are stored for use by the processor during in-service temperature variations.

35 Claims, 3 Drawing Sheets

METHODS FOR RADIO CALIBRATION AT ROOM TEMPERATURE

FIELD OF THE INVENTION

The present invention relates to the field of radio communications, and, more particularly, to the calibration of radios.

BACKGROUND OF THE INVENTION

In general, a radio system, e.g., an outdoor radio system, requires an accurate indication of both Receive Signal Level ("RSL") and Output Power Indication ("OPI") for field installation, service, and monitoring applications. U.S. Pat. Nos. 5,423,070 and 5,230,091 to Vaisanen et al., for example, are directed to tuning and compensating power levels in a radio telephone. The radio telephone includes sensors, connected to a processor, for detecting the radio's operating channel and temperature ranges. The tuning of the radio is performed as a final stage in production. Specifically, external tuning equipment is connected to the radio to measure the power level of the transmitter. This power level is adjusted until the desired power level is achieved. Individual tuning results are stored in a memory as compensating values for use in controlling the transmitter power during operation. Thus, during operation, a logic controlled amplifier in the signal path amplifies the signal according to data corrected with the compensating values that correspond to the operating conditions.

U.S. Pat. No. 5,471,654 to Okazaki et al. discloses a radio capable of setting the level of power for transmitting an output signal, which correctly corresponds to the level of a received signal, without dependency upon change in the environmental temperature. The unit includes a temperature-dependent type automatic gain control (AGC) voltage generating circuit for converting a DC voltage (generated in proportion to a level of an output signal from a variable-gain amplifier) into an automatic gain control which depends on a change in environmental temperature. In other words, the level of the output AGC voltage is raised or lowered if the environmental temperature has been raised above or lowered below room temperature.

A temperature-compensated AGC circuit is also disclosed in U.S. Pat. No. 5,408,697 to Price. The circuit includes a gain independent compensation circuit for creating a second compensation signal responsive to temperature according to a predetermined characteristic. Specifically, the compensation circuit includes a thermistor to provide a receiver gain compensation signal to adjust the receiver amplifier gain responsive to temperature.

Also, U.S. Pat. No. 5,873,029 to Grondahl is directed to a millimeter wave power detector with temperature compensation. An RF power detector includes an RF detector circuit which converts an RF signal to a voltage representative of the RF signal's power level. A temperature compensation element provides a temperature compensation signal to compensate for the temperature effects of the detector elements of the RF detector circuit.

Conventional calibration techniques include characterizing each radio over temperatures. The disadvantage of such an approach is that this requires extensive calibration time and usually becomes a bottleneck for mass production. For example, it may take 12 hours to calibrate a group of radios, with each calibrated over a temperature range.

SUMMARY OF THE INVENTION

In view of the foregoing background, it is therefore an object of the invention to provide a radio calibration method which reduces the time required for calibration.

This and other objects, features and advantages in accordance with the present invention are provided by a method for calibrating each radio of a plurality of radios at room temperature. More particularly, each radio preferably comprises a plurality of variable gain stages connected in series, at least one power detector connected to the variable gain stages, a temperature sensor, and a processor for controlling the variable gain stages in-service based upon the power detector, temperature sensor, and stored frequency and power compensation values. The method preferably includes generating frequency compensation values for at least one first variable gain stage by supplying a first calibration signal swept in frequency and while maintaining the radio at a constant temperature. The method may further include generating power compensation values for at least one second variable gain stage by supplying a second calibration signal swept in power level, and while maintaining the radio receiver at a constant temperature. The constant temperature is preferably room temperature, e.g. 65–75° F. The frequency and power compensation values generated at the constant temperature are then stored for use by the processor during in-service temperature variations.

The method preferably includes the step of varying a temperature for at least one radio while performing the generating steps to generate temperature factors to be used for radios calibrated at the constant temperature. The temperature factors may be used to generate the frequency and power compensation values. Also, the temperature factors may be stored for use by the processor in combination with the frequency and power compensation values during in-service temperature variations.

The method may further include the step of maintaining the at least one second variable gain stage in a predetermined linear portion of a dynamic range thereof during the step of generating frequency compensation values. Also, the at least one first variable gain stage may be downstream from the at least one second variable gain stage and each variable gain stage may comprise at least one variable attenuator.

The radio may further include a receiver signal level indicator for indicating the received signal level in-service based upon the frequency and power compensation values. Also, a constant power level is maintained while generating the frequency and power level compensation values. The calibration method may be performed on a receiver, transmitter or both, of the radio. Furthermore, for the receiver, the method may include the step of maintaining the at least one second variable gain stage in a predetermined linear portion of a dynamic range thereof during the step of generating frequency compensation values.

For the transmitter, the method may further include the step of setting the second at least one variable gain stage to produce a nominal power level output. Also, the transmitter may further comprise at least one mixer upstream of the first and second gain stages and at least one gain stage upstream of the at least one mixer. Accordingly, the method may further include the step of verifying operation of the at least one third gain stage in combination with the processor.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
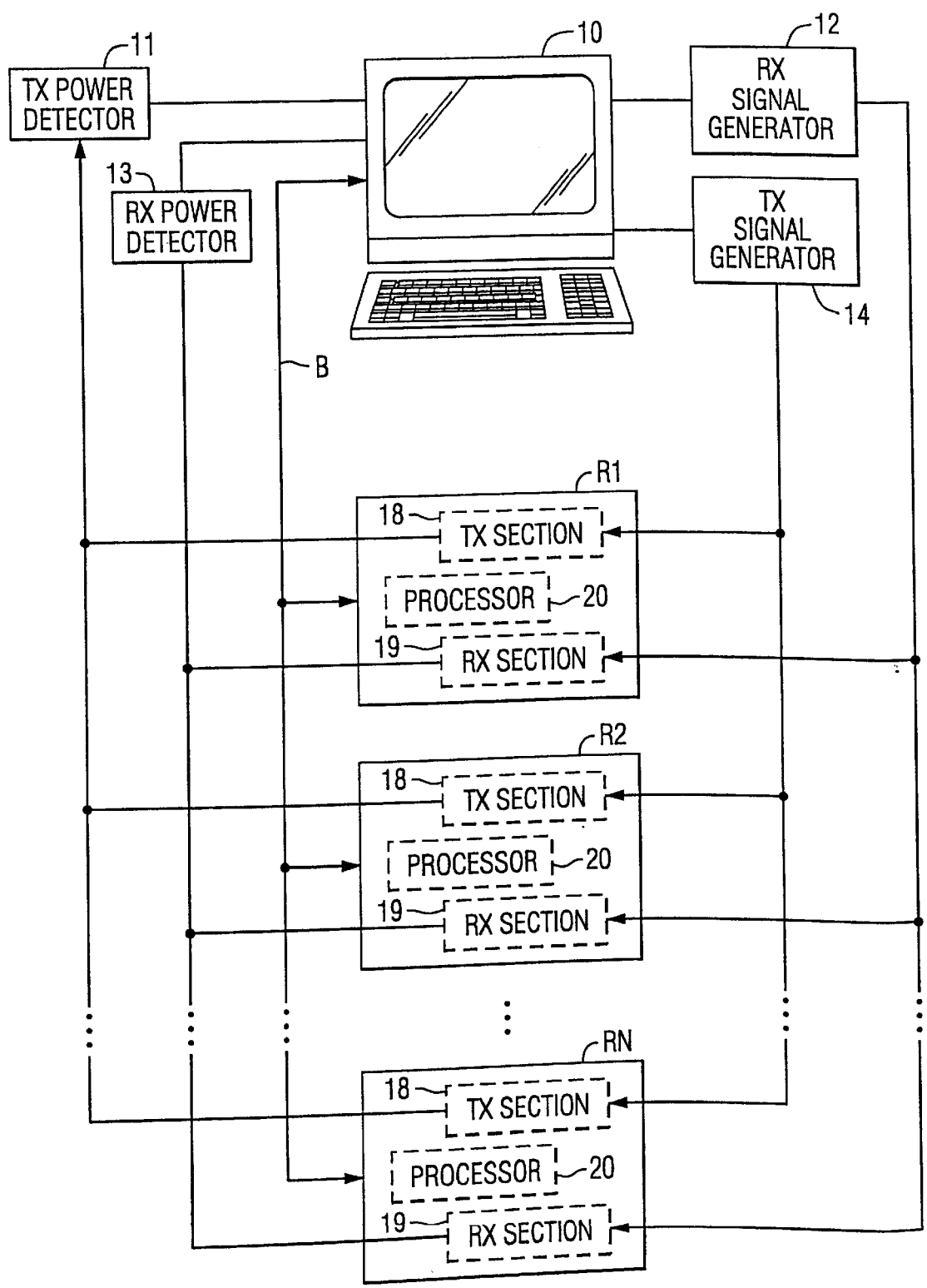
FIG. 1 is a schematic diagram illustrating the calibration of a plurality of radios in accordance with the method of the present invention.
Figure 2:
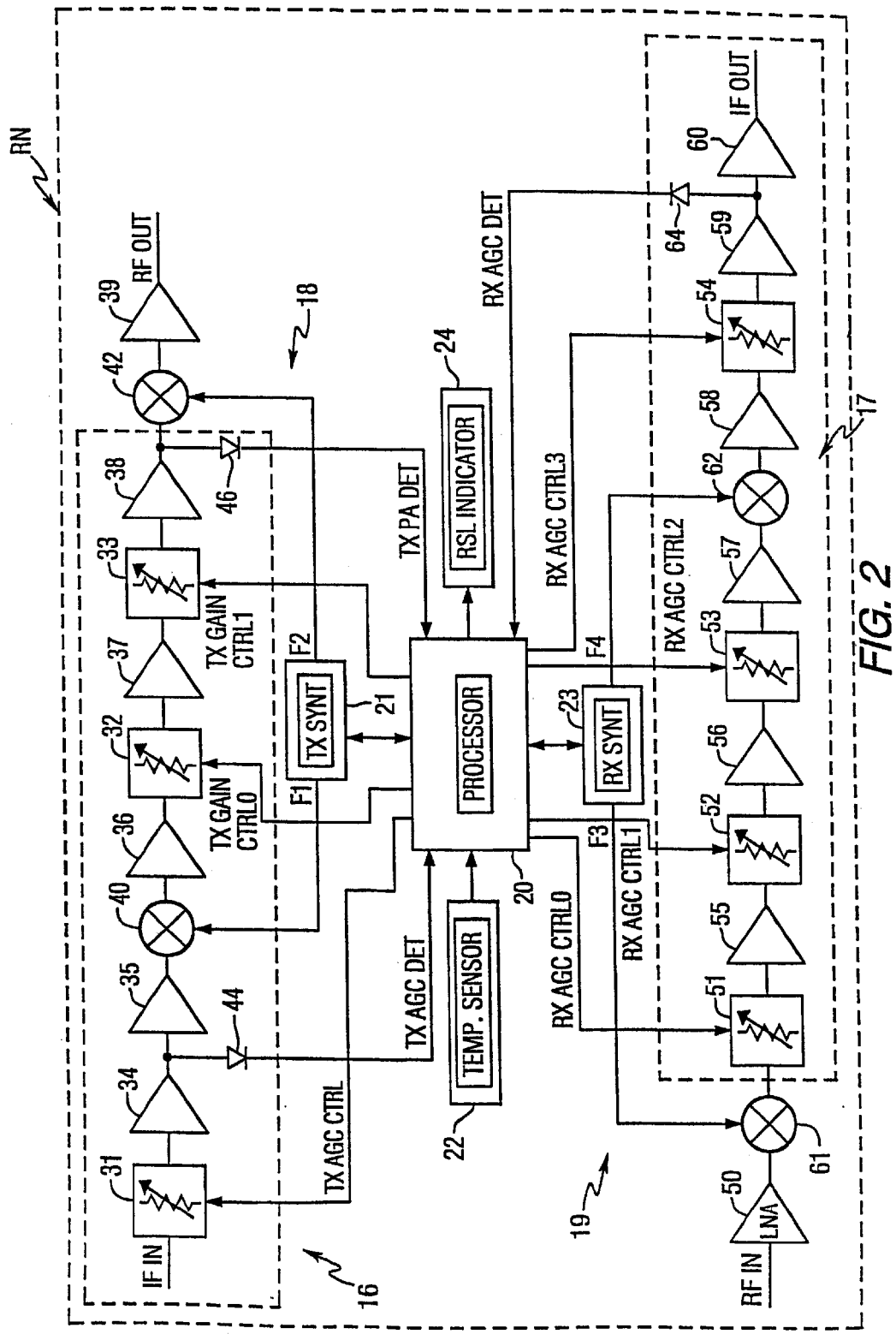
FIG. 2 is a simplified schematic diagram of a radio used in the method of the present invention.

Referring to FIGS. 1 and 2, typically, a plurality of radios or radio communication outdoor units (ODUs) R1-RN are simultaneously calibrated prior to field installation. A calibration process controller 10 controls a receiver signal generator 12 and a transmitter signal generator 14 to generate calibration signals to the ODUs R1-RN. The calibration process controller 10 also takes the measurement of the RF OUT (TX) and IF OUT (RX) signals, via the TX power detector 11 and RX power detector 13, respectively. The calibration process controller 10 communicates with the ODUs R1-RN via a communication bus B.

Each ODU R1-RN includes a processor 20, e.g., a microprocessor, for controlling various operations within the radio unit. Each ODU R1-RN also includes a temperature sensor 22 and a receiver signal level (RSL) indicator 24 for the RF IN.

A receiver section 19 (RX) of the ODU R1-RN preferably includes, for example, a plurality of automatic gain control (AGC) variable attenuators 51–54 and a plurality of amplifiers 55–60. One variable attenuator and an associated amplifier, e.g. 51 and 55, may comprise a variable gain stage. The receiver section 19 further includes a low noise amplifier (LNA) 50 and mixers 61 and 62. These mixers 61 and 62 are controlled through signal lines F3 and F4 via RX synthesizer 23. The LNA 50 and the mixer 61 make up the variable frequency portion of the receiver section 19. The remaining variable gain stages and the mixer 62 make up the fixed frequency portion 17 of the receiver section 19.

A transmitter section 18 (TX) of the ODU R1-RN preferably includes, for example, a plurality of automatic gain control (AGC) variable attenuators 31–33 and a plurality of associated amplifiers 34–39. One variable attenuator and an associated amplifier, e.g. 32 and 37, may comprise a variable gain stage. The transmitter section 18 further includes mixers 40 and 42. These mixers 40 and 42 are controlled through signal lines F1 and F2 via TX synthesizer 21. The amplifier 39 and the mixer 42 make up the variable frequency portion of the transmitter section 18. The remaining variable gain stages and the mixer 40 make up the fixed frequency portion 16 of the transmitter section 18.

In the field, the processor 20 reads the temperature sensor 22 of the radio, reads input/output power diode detectors 44, 46, 64, and adjusts AGC variable attenuators 31–33 and 51–54 for maintaining the transmitted RF OUT and received IF OUT signals at desired levels.

The calibration method of the ODUs will be described below. It is noted that the calibration method is performed in view of the following two concepts:

(1) At first, the overall variation in gain of an ODU from unit-to-unit is compensated for. One variable attenuator is preferably adjusted to have a fixed gain over frequency, at a predetermined operating condition. Once the attenuator is adjusted, its control voltage is maintained constant. It is important to note that this approach puts every ODU at the same calibration starting point. Yield problems are then considerably reduced.

(2) Second, the calibration is performed at room temperature, e.g. 65–75° F. Each variable attenuator is used only in its linear range which facilitates the compensation when the used in-service and the temperature changes. A temperature correction factor is computed to take into account the temperature effect, e.g. using mathematical formulas. This temperature correction factor includes corrections for the variations of attenuators versus temperature and versus the control voltage, and the variation of every gain stage over temperature.

The dynamic ranges of the RSL and the TX output power are, for example, 80 dB and 20 dB respectively. The RX section 19 contains one power detector 64 at a fixed Intermediate Frequency (IF) which generates the signal RX_AGC_DET. The processor 20 provides feedback controlling voltages, namely RX_AGC_CTRL0, CTRL1, CTRL2, and CTRL3. These voltages adjust the attenuators 51–54 respectively. The attenuator 54 (controlled by CTRL3 voltage) can be assigned for the RX overall gain compensation. The attenuators 51–53 (having a typical linear dynamic range of 90 dB) are used for an RSL calibration.

The calibration of the RX AGC loop is based on the RX_AGC_DET voltage. The processor 20 should be able to adjust the RX section 19 and refresh the RSL indicator in a reasonable delay (35 msec. typical). During the overall gain compensation, a signal swept in frequency (e.g. at least two frequencies) characterizes the low noise amplifier 50 and the mixer 61. The control voltages CTRL0–CTRL3 of attenuators 51–53 can be set at the middle of their linear dynamic range. The attenuator 54 is adjusted to have a constant gain. The control voltage CTRL4 of the attenuator 54 is then stored in a memory for each frequency.

The receiver section 19 should be designed such that these control voltages CTRL4 will be in a range where the attenuator 54 varies the least over temperature. During the RSL calibration, the RX frequency can be fixed at a center value. The attenuators 51–53 are then adjusted to maintain a constant RX_AGC_DET voltage (i.e., first IF constant output power). Furthermore, a predetermined RX_AGC_DET voltage is used during the calibration of the plurality of radios R1-RN. The first IF constant output power can be slightly different from unit to unit due to the variation in gain of the amplifier 60. The process controller 10 can verify if the IF OUT variation is within an acceptable margin through the use of the RX power detector 13. The control voltages CTRL0–CTRL2 can be stored in 1.0 dB steps (or higher) of the received input signal RF IN. Over temperature, the processor 20 will take into account the temperature correction factors and compute the true level of the received signal.

Figure 3:
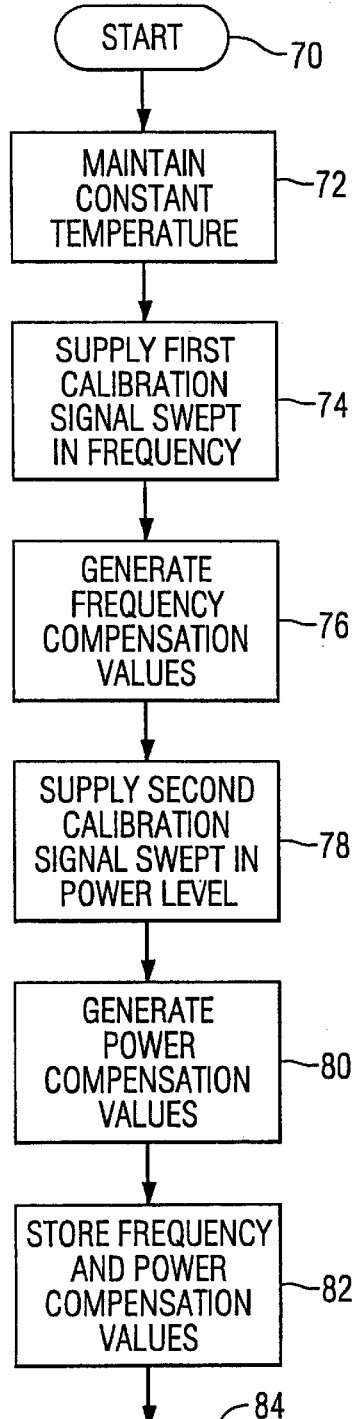
FIG. 3 is a flow-chart illustrating the calibration method steps of the present invention as applied to a receiver section of the radio.

In other words, referring to the flow chart of FIG. 3, the radios R1-RN are maintained at a constant temperature (Block 72) while the calibration process controller 10 controls the RX signal generator 12 to supply a first calibration signal swept in frequency (Block 74). At Block 76, the calibration process controller 10 generates frequency compensation values for at least one first variable gain stage, e.g. for attenuator 54 and associated amplifier 59. Furthermore, the calibration process controller 10 controls the RX signal generator 12 to supply a second calibration signal swept in power level (Block 78). At Block 80, power compensation values are generated for at least one second variable gain stage, e.g. attenuator 51 and associated amplifier 55. The constant temperature is preferably room temperature, e.g. 65–75° F. The frequency and power compensation values generated at the constant temperature are then stored (Block 82) for use by the processor 20 during in-service temperature variations.

The transmitter section 18 typically includes two independent loops: 1) The Automatic Gain Control (AGC) loop, which involves the TX_AGC_CTRL and TX_AGC_DET signals. This AGC loop compensates for various losses due to the different cable length between the indoor and outdoor unit. 2) The Power Amplification (PA) loop, involves the TX_GAIN_CTRL0, TX_GAIN_CTRL1, and TX_PA_DET signals. The output variation range determines how many variable attenuators are required.

The calibration of the TX section 18 includes: (a) verifying the AGC loop; (b) compensating for the gain from mixer 40 to RF output; and (c) calibrating the PA loop. A refresh time of 35 milliseconds is typical.

The TX_AGC_CTRL signal adjusts one variable attenuator 31 to maintain constant power at the output of the amplifier 34 which is indicated directly by the TX_AGC_DET signal. This loop needs a well functioning verification, but does not need calibration. The TX_GAIN_CTRL0 signal adjusts the variable attenuator 32 for compensating the TX gain from the input of the amplifier 35 to the RF output. The TX_GAIN_CTRL1 is fixed near the lowest attenuation voltage. A signal swept over frequency (e.g. at least two frequencies) characterizes the second mixer 42 and the RF output. The control voltage of this variable attenuator 33 is stored in memory for each frequency. During this step, the output power is at a nominal level. The TX_PA_DET is also stored. During the power level calibration, the TX frequency can be settled at midpoint of a frequency range. The calibration can be based on the TX_PA_DET if the dynamic range is relatively narrow. For a 30 dB range or more, it could be a blind calibration.

Figure 4:
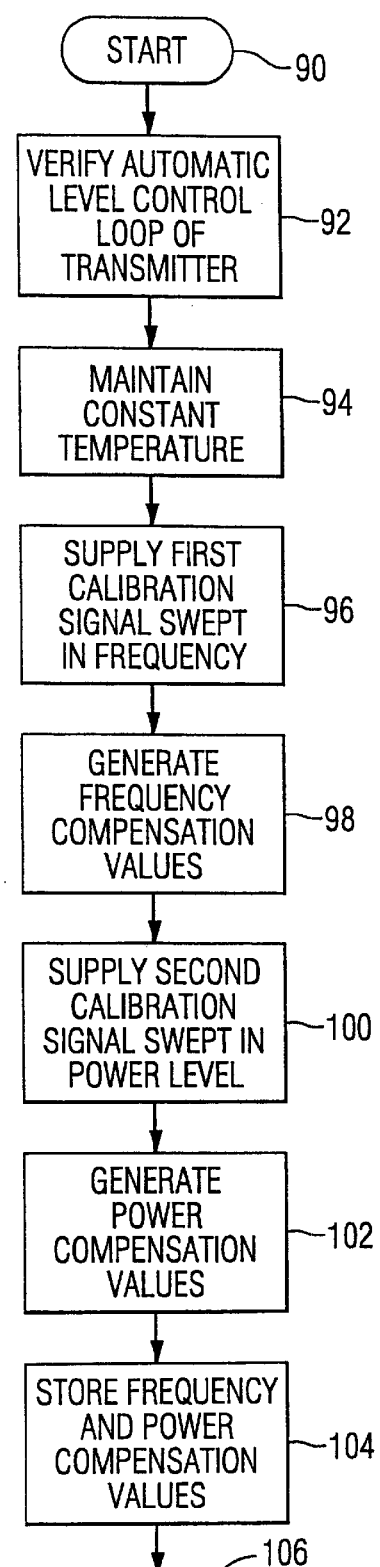
FIG. 4 is a flow-chart illustrating the calibration method steps of the present invention as applied to a transmitter section of the radio.

Referring to the flow chart of FIG. 4, the radios R1-RN are maintained at a constant temperature (Block 94) while the calibration process controller 10 controls the TX signal generator 14 and TX synthesizer 21 to supply a first calibration signal swept in frequency (Block 96). During this frequency sweep, the calibration process controller 10 also reads the TX power detector 11 to monitor the TX RF OUT signal. At Block 98, the calibration process controller 10 generates frequency compensation values for at least one first variable gain stage, e.g. for attenuator 32 and associated amplifier 37. Furthermore, the calibration process controller 10 controls the TX signal generator 14 and the variable gain stage, and reads the TX power detector 11, to supply a second calibration signal swept in power level (Block 100). At Block 102, power compensation values are generated for at least one second variable gain stage, e.g. attenuator 33 and associated amplifier 38. The constant temperature is preferably room temperature, e.g. 65–75° F. The frequency and power compensation values generated at the constant temperature are then stored (Block 104) for use by the processor 20 during in-service temperature variations. The method may initially include, at Block 92, the step of verifying operation of the AGC loop, i.e. variable gain stage 31 and 34, for example, so that a constant power level is maintained at the output of amplifier 35.

It is further noted, for each of the receiver section and the transmitter section, that while the RX and TX signal generators 12 and 14 are supplying the calibration signals swept in frequency, the power is maintained constant. Likewise, while the RX and TX signal generators 12 and 14 are supplying the calibration signals swept in power level, the frequency is maintained constant.

The method preferably includes the step of varying a temperature for at least one radio while performing the above compensation value generating steps to generate temperature factors to be used for the other radios calibrated at the constant temperature. The temperature factors may be used to generate the frequency and power compensation values. Also, the temperature factors may be stored for use by the processor 20 in combination with the frequency and power compensation values during in-service temperature variations.

The present calibration method advantageously provides a significant reduction in calibration time, e.g., from 12 hours to less than 1 hour, a significant increase in unit calibration throughput, and a large reduction in product manufacturing costs.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for calibrating each radio of a plurality of radios, each radio comprising a plurality of variable gain stages connected in series, at least one power detector connected to the variable gain stages, a temperature sensor, and a processor for controlling the variable gain stages in-service based upon the at least one power detector, the temperature sensor, and stored frequency and power compensation values, the method comprising the steps of:

generating frequency compensation values for at least one first variable gain stage by supplying a first calibration signal swept in frequency and while maintaining the radio at a constant temperature;

generating power compensation values for at least one second variable gain stage by supplying a second calibration signal swept in power level and while maintaining the radio receiver at a constant temperature; and storing the frequency and power compensation values generated at the constant temperature to be used by the processor during in-service temperature variations.

2. A method according to claim 1 further comprising the step of varying a temperature for at least one radio while performing the generating steps to generate temperature factors to be used for radios calibrated at the constant temperature.

3. A method according to claim 2 further comprising the step of using the temperature factors to generate the frequency and power compensation values.

4. A method according to claim 2 further comprising the step of storing the temperature factors to be used by the processor in combination with the frequency and power compensation values during in-service temperature variations.

5. A method according to claim 1 further comprising the step of maintaining the at least one second variable gain stage in a predetermined linear portion of a dynamic range thereof during the step of generating frequency compensation values.

6. A method according to claim 1 wherein the at least one first variable gain stage is downstream from the at least one second variable gain stage.

7. A method according to claim 1 wherein each variable gain stage comprises at least one variable attenuator.

8. A method according to claim 1 wherein the constant temperature is room temperature.

9. A method according to claim 1 wherein the radio further comprises a receiver signal level indicator for indicating the received signal level in-service based upon the frequency and power compensation values.

10. A method according to claim 1 wherein the step of generating frequency compensation values comprises supplying the first calibration signal swept in frequency while maintaining a constant power level thereof.

11. A method according to claim 1 wherein the step of generating power compensation values comprises supplying the second calibration signal swept in power level while maintaining a constant frequency thereof.

12. A method according to claim 1 wherein the radio comprises a radio receiver which includes the plurality of variable gain stages.

13. A method according to claim 1 wherein the radio comprises a radio transmitter which includes the plurality of variable gain stages.

14. A method according to claim 1 wherein the radio comprises a radio receiver and transmitter which include the plurality of variable gain stages.

15. A method for calibrating each radio receiver of a plurality of radio receivers, each radio receiver comprising a plurality of variable gain stages connected in series, at least one power detector connected to the variable gain stages, a temperature sensor, and a processor for controlling the variable gain stages in-service based upon the at least one power detector, the temperature sensor, and stored frequency and power compensation values, the method comprising the steps of:
   generating frequency compensation values for at least one first variable gain stage by supplying a first calibration signal swept in frequency and while maintaining the radio receiver at a constant temperature;
   generating power compensation values for at least one second variable gain stage by supplying a second calibration signal swept in power level and while maintaining the radio receiver at a constant temperature; and
   storing the frequency and power compensation values generated at the constant temperature to be used by the processor during in-service temperature variations.

16. A method according to claim 15 further comprising the step of varying a temperature for at least one radio receiver while performing the generating steps to generate temperature factors to be used for radio receivers calibrated at the constant temperature.

17. A method according to claim 16 further comprising the step of using the temperature factors to generate the frequency and power compensation values.

18. A method according to claim 16 further comprising the step of storing the temperature factors to be used by the processor in combination with the frequency and power compensation values during in-service temperature variations.

19. A method according to claim 15 further comprising the step of maintaining the at least one second variable gain stage in a predetermined linear portion of a dynamic range thereof during the step of generating frequency compensation values.

20. A method according to claim 15 wherein the at least one first gain stage is downstream from the at least one second gain stage.

21. A method according to claim 15 wherein each gain stage comprises at least one variable attenuator.

22. A method according to claim 15 wherein the constant temperature is room temperature.

23. A method according to claim 15 wherein the radio receiver further comprises a receiver signal level indicator for indicating the received signal level in-service based upon the frequency and power level compensation values.

24. A method according to claim 15 wherein the step of generating frequency compensation values comprises supplying the first calibration signal swept in frequency while maintaining a constant power level thereof.

25. A method according to claim 15 wherein the step of generating power compensation values comprises supplying the second calibration signal swept in power level while maintaining a constant frequency thereof.

26. A method for calibrating each radio transmitter of a plurality of radio transmitters, each radio transmitter comprising a plurality of variable gain stages connected in series, at least one power detector connected to the variable gain stages, a temperature sensor, and a processor for controlling the variable gain stages in-service based upon the at least one power detector, the temperature sensor, and stored frequency and power compensation values, the method comprising the steps of:
   generating frequency compensation values for at least one first variable gain stage by supplying a first calibration signal swept in frequency and while maintaining the radio transmitter at a constant temperature;
   generating power compensation values for at least one second variable gain stage by supplying a second calibration signal swept in power level and while maintaining the radio transmitter at a constant temperature; and
   storing the frequency and power compensation values generated at the constant temperature to be used by the processor during in-service temperature variations.

27. A method according to claim 26 further comprising the step of setting the second at least one variable gain stage to produce a nominal power level output.

28. A method according to claim 26 wherein the transmitter further comprises at least one mixer upstream of the first and second gain stages and at least one gain stage upstream of the at least one mixer; and further comprising the step of verifying operation of the at least one third gain stage in combination with the processor.

29. A method according to claim 26 further comprising the step of varying a temperature for at least one radio transmitter while performing the generating steps to generate temperature factors to be used for radio transmitters calibrated at the constant temperature.

30. A method according to claim 29 further comprising the step of using the temperature factors to generate the frequency and power compensation values.

31. A method according to claim 29 further comprising the step of storing the temperature factors to be used by the processor in combination with the frequency and power compensation values during in-service temperature variations.

32. A method according to claim 26 wherein each gain stage comprises at least one variable attenuator.

33. A method according to claim 26 wherein the constant temperature is room temperature.

34. A method according to claim 26 wherein the step of generating frequency compensation values comprises supplying the first calibration signal swept in frequency while maintaining a constant power level thereof.

35. A method according to claim 26 wherein the step of generating power compensation values comprises supplying the second calibration signal swept in power level while maintaining a constant frequency thereof.

* * * * *